(12) United States Patent
Huang et al.

(10) Patent No.: US 11,031,302 B2
(45) Date of Patent: Jun. 8, 2021

(54) HIGH-K METAL GATE AND METHOD FOR FABRICATING THE SAME

(71) Applicant: Taiwan Semiconductor Manufacturing Co., Ltd., Hsinchu (TW)

(72) Inventors: Ju-Li Huang, Mingjian Township (TW); Chih-Long Chiang, Jhubei (TW); Kuo Bin Huang, Jhubei (TW); Ming-Hsi Yeh, Hsinchu (TW); Ying-Liang Chuang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 8 days.

(21) Appl. No.: 16/517,767

(22) Filed: Jul. 22, 2019

(65) Prior Publication Data

US 2019/0341317 A1  Nov. 7, 2019

Related U.S. Application Data

(62) Division of application No. 15/707,990, filed on Sep. 18, 2017, now Pat. No. 10,361,133.

(51) Int. Cl.
*H01L 21/8238* (2006.01)
*H01L 29/51* (2006.01)
(Continued)

(52) U.S. Cl.
CPC .. *H01L 21/823857* (2013.01); *H01L 21/0206* (2013.01); *H01L 21/0229* (2013.01); *H01L 21/02175* (2013.01); *H01L 21/28229* (2013.01); *H01L 21/3105* (2013.01); *H01L 21/31111* (2013.01); *H01L 21/823431* (2013.01); *H01L 21/823462* (2013.01); *H01L 21/823821* (2013.01); *H01L 21/823842* (2013.01);
(Continued)

(58) Field of Classification Search
None
See application file for complete search history.

(56) References Cited

U.S. PATENT DOCUMENTS 7,816,671 B2   10/2010   Park et al.
9,105,490 B2   8/2015    Wang et al.
(Continued)

OTHER PUBLICATIONS

Dorothee Brovelli et al., "Highly Oriented, Self-Assembled Alkanephosphate Monolayers on Tantalum(V) Oxide Surfaces" American Chemical Society, Langmuir, vol. 15, No. 13, 1999, pp. 4324-4327.
(Continued)

*Primary Examiner* — Long Pham
(74) *Attorney, Agent, or Firm* — Slater Matsil, LLP

(57) ABSTRACT

Embodiments of the present disclosure provide wet process based methods for modifying threshold value (Vt) of high-k metal gate using self-assembled monolayer (SAM) on dedicated transistor. In one embodiment, the method includes forming a gate structure over a substrate, the gate structure comprising a gate dielectric layer, a barrier layer formed over the gate dielectric layer, and an oxide layer formed over the barrier layer, and forming a self-assembled monolayer on the oxide layer by exposing the oxide layer to an aqueous solution containing metal oxides in a metal dissolving acid.

20 Claims, 14 Drawing Sheets

(51) Int. Cl.
  *H01L 27/088* (2006.01)
  *H01L 21/28* (2006.01)
  *H01L 21/8234* (2006.01)
  *H01L 21/311* (2006.01)
  *H01L 21/02* (2006.01)
  *H01L 21/3105* (2006.01)
  *H01L 29/49* (2006.01)

(52) U.S. Cl.
  CPC ........ *H01L 27/088* (2013.01); *H01L 29/4966* (2013.01); *H01L 29/513* (2013.01); *H01L 29/517* (2013.01); *H01L 21/02178* (2013.01); *H01L 21/02183* (2013.01); *H01L 21/02186* (2013.01)

(56) References Cited

U.S. PATENT DOCUMENTS

| | | | |
|---|---|---|---|
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 10,361,133 | B2 * | 7/2019 | Huang ................. H01L 27/088 |
| 2004/0266207 | A1 * | 12/2004 | Sirringhauss ....... H01L 51/0023 438/725 |
| 2013/0105918 | A1 * | 5/2013 | Mieno ............... H01L 21/02181 257/410 |
| 2015/0236285 | A1 * | 8/2015 | Afzali-Ardakani .......................... H01L 29/125 257/24 |
| 2019/0088556 | A1 * | 3/2019 | Huang ................. H01L 29/513 |
| 2019/0341317 | A1 * | 11/2019 | Huang ............. H01L 21/28185 |

OTHER PUBLICATIONS

Ellen S. Gawalt et al., "Enhanced Bonding of Alkanephosphonic Acids to Oxidized Titanium Using Surface-Bound Alkoxyzirconium Complex Interfaces" American Chemical Society, Langmuir, vol. 15, No. 26, 1999, pp. 8929-8933.

Marcus Textor et al., "Structural Chemistry of Self-Assembled Monolayers of Octadecylphosphoric Acid on Tantalum Oxide Surfaces" American Chemical Society, Langmuir, vol. 16, No. 7, 2000, pp. 3257-3271.

S. Tosatti et al., "Self-Assembled Monolayers of Dodecyl and Hydroxy-dodecyl Phosphates on Both Smooth and Rough Titanium and Titanium Oxide Surfaces" American Chemical Society, Langmuir, vol. 18, No. 9, 2002, pp. 3537-3548.

* cited by examiner

HIGH-K METAL GATE AND METHOD FOR FABRICATING THE SAME

PRIORITY CLAIM AND CROSS-REFERENCE

This application is a divisional of U.S. application Ser. No. 15/707,990, filed on Sep. 18, 2017, entitled "High-K Metal Gate and Method for Fabricating the Same", which application is hereby incorporated herein by reference.

BACKGROUND

Semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, when fabricating field effect transistors (FETs), such as fin-like FETs (FinFETs), device performance can be improved by using a metal gate electrode instead of a typically polysilicon gate electrode. One process of forming a metal gate stack is termed a replacement-gate or "gate-last" process in which the final gate stack is fabricated "last" which allows for reduced number of subsequent processes, including high temperature processing, that is performed after formation of the gate. Metal gate electrode generally includes a gate dielectric layer, a work function metal layer, and a gate metal electrode. The work function metal layer may use different materials for different types of transistors, such as p-type FinFET or n-type FinFET, to fine tune threshold voltage (Vt) of the transistor and thus enhance device electrical performance as needed. However, there are challenges to depositing the work function metal layer, especially with scaled down IC features and complex surface topology in advanced process nodes and beyond. One challenge is that deposition of work function metal in small gate length is complicated and costly as it requires multiple hardmask deposition/patterning, metal wet etch, hardmask removal, and post cleaning processes for threshold voltage (Vt) manipulation for NMOS or PMOS. In the meantime, the thickness of work function metal to be deposited is limited due to smaller CD for advanced process nodes. Furthermore, metal patterning processes may damage metal barrier layers provided between the metal gate electrode and a gate dielectric layer. Consequently, metal materials may intrude into the gate dielectric layer, causing device defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
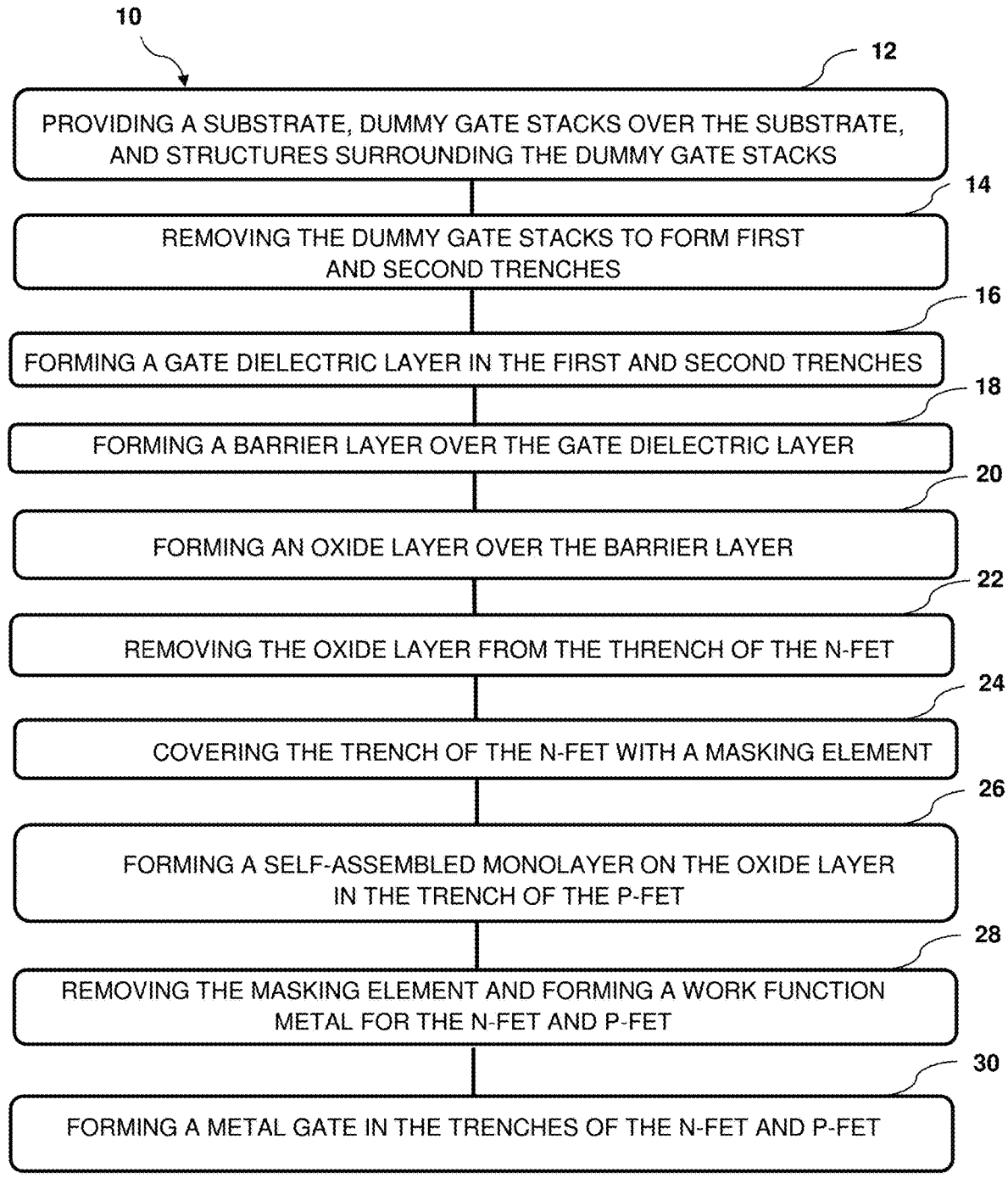
FIG. 1 is a flow chart of an exemplary method for fabricating a semiconductor device according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus or structure may be otherwise oriented (rotated 90 degrees or at other orientations) and the spatially relative descriptors used herein may likewise be interpreted accordingly.

The present disclosure is generally related to semiconductor devices, and more particularly to semiconductor devices having FinFETs. It is an objective of the present disclosure to provide wet process based methods for modifying threshold value (Vt) of high-k metal gate using self-assembled monolayer (SAM) on dedicated transistor.

FIG. 1 is a flow chart of an exemplary method 10 for fabricating a semiconductor device according to various embodiments of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2-13 that illustrate a portion of a semiconductor device 100 at various fabrication stages. The device 100 may be an intermediate device fabricated during processing of an IC, or a portion thereof, that may comprise static random access (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 2:
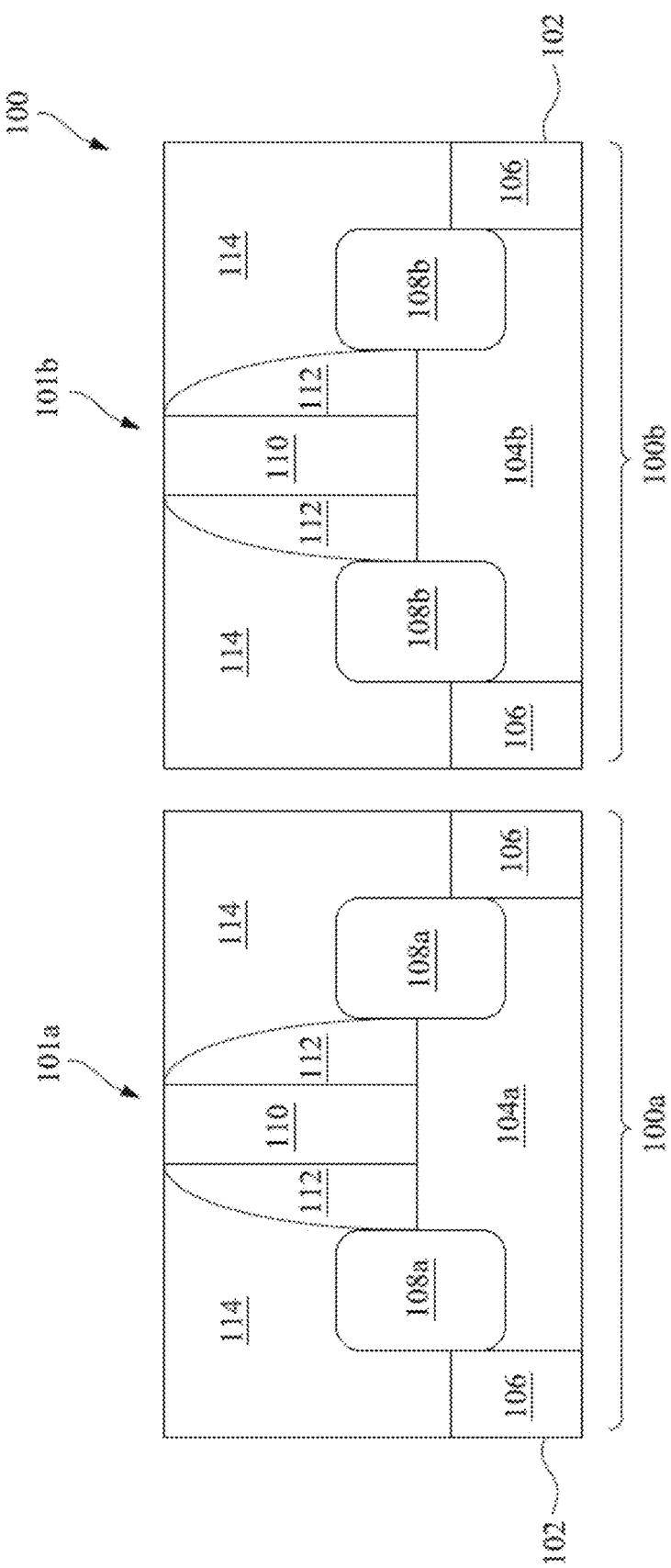
FIGS. 2-14 illustrate a portion of a semiconductor device at various fabrication stages according to the flow chart of FIG. 1.

The method 10 (FIG. 1) begins at operation 12 where a substrate 102 is provided with various structures formed therein and/or thereon. Referring to FIG. 2, the device 100 includes the substrate 102 and isolation structures 106 over the substrate 102. The isolation structures 106 separate the device 100 into various device regions. In the example as shown, the device 100 includes an n-FET device region 100a and a p-FET device region 100b. In the present embodiment, the device 100 includes FinFETs and the substrate 102 includes two active fin structures 104a and 104b that project upwardly through the isolation structures 106. The two fin structures 104a and 104b are in the device regions 100a and 100b respectively.

FIGS. 2-13 are schematic cross sectional views of a portion of the device 100 along a fin length direction of the respective fin structures 104a/b. In various embodiments, the device regions 100a and 100b can be contiguous or non-contiguous. It is understood that the present disclosure is not limited to any particular number of devices or device regions, or to any particular device configurations.

The device 100 further includes gate structures 101a and 101b in the device regions 100a and 100b respectively. The gate structures 101a and 101b each includes a dummy gate stack 110 and a spacer feature 112 on sidewalls of the dummy gate stack 110. The gate structures 101a and 101b each engages or abuts a portion of the active fin structures 104a and 104b respectively. The device 100 further includes source/drain regions 108a and 108b in the respective fin structures 104a and 104b, disposed on or adjacent to opposite sides of the respective gate structures 101a and 101b. The device 100 further includes an inter-layer dielectric (ILD) layer 114 surrounding the gate structures 101a and 101b. The various aforementioned structures of the device 100 will be further described below.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as a buried dielectric layer.

In the present embodiment, the fin 104a is suitable for forming an n-type FinFET, and the fin 104b is suitable for forming a p-type FinFET. This configuration is for illustrative purposes only and does not limit the present disclosure. The fin structures 104a/b may be fabricated using suitable processes including photolithography and etch processes. The photolithography process may include forming a photoresist layer (resist) overlying the substrate 102, exposing the resist to a pattern, performing post-exposure bake processes, and developing the resist to form a masking element including the resist. The masking element is then used for etching recesses into the substrate 102, leaving the fin structures 104a/b on the substrate 102. The etching process can include dry etching, wet etching, reactive ion etching (RIE), and/or other suitable processes. Alternatively, the fin structures 104a/b may be formed using mandrel-spacer double patterning lithography.

The isolation structures 106 may be formed of silicon oxide, silicon nitride, silicon oxynitride, fluoride-doped silicate glass (FSG), a low-k dielectric material, and/or other suitable insulating material. The isolation structures 106 may be shallow trench isolation (STI) features. In an embodiment, the isolation structures 106 are formed by etching trenches in the substrate 102, e.g., as part of the fin structures 104a/b formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 106 may include a multi-layer structure, for example, having one or more thermal oxide liner layers.

The dummy gate stacks 110 engage the fin structures 104a/b on two or three sides of the fin structures in the present embodiment. It is termed "dummy" because it will be removed in a later stage and will be replaced with a "real" gate stack such as a high-k metal gate in a "gate-last" process. The dummy gate stacks 110 may include one or more material layers, such as an oxide layer, a poly-silicon layer, a hard mask layer, a capping layer, and other suitable layers. The various layers in the dummy gate stacks 110 may be formed by suitable deposition techniques. For example, the oxide layer may be formed by chemical oxidation, thermal oxidation, atomic layer deposition (ALD), chemical vapor deposition (CVD), and/or other suitable methods. For example, the poly-silicon layer may be formed by suitable deposition processes such as low-pressure chemical vapor deposition (LPCVD) and plasma-enhanced CVD (PECVD). In an embodiment, the dummy gate stacks 110 are first deposited as blanket layers. Then the blanket layers are patterned through a process including photolithography processes and etching processes thereby removing portions of the blanket layers and keeping the remaining portions over the isolation structure 106 and the fin structures 104a/b as the dummy gate stacks 110.

The spacer feature 112 is formed on sidewalls of the dummy gate stacks 110. The spacer feature 112 includes a material different from the material(s) for the dummy gate stacks 110. In an embodiment, the spacer feature 112 includes a dielectric material, such as silicon nitride, silicon oxynitride, silicon carbide, silicon carbon, silicon oxide, silicon hydrogen, other applicable materials. In an example, the spacer feature 112 includes multiple layers, such as a seal layer adjacent to the dummy gate stacks 110 and a main spacer layer adjacent to the seal layer. In an embodiment, after the dummy gate stacks 110 have been formed, one or more spacer layers are formed by blanket depositing spacer materials over the device 100. Then, an anisotropic etching process is performed to remove portions of the spacer layers to form the spacer feature 112 as illustrated in FIG. 2.

The source/drain regions 108a and 108b may include source/drain features and may be formed by various techniques, such as etching processes followed by one or more epitaxy processes. In one example, one or more etching processes are performed to remove portions of the fin structures 104a/b to form recesses therein. A cleaning process may be performed that cleans the recesses with a hydrofluoric acid (HF) solution or other suitable solution. Subsequently, one or more epitaxial growth processes are performed to grow S/D features in the recesses. While not shown, it is contemplated that after the S/D features have been filled in the recesses, the S/D features may expand outside the recesses and form facets. The facets may be formed with various profiles, for example a diamond-shaped cross-section profile when viewed along the fin width direction of the respective fin structures 104a/b, due to the differences in the growth rate on different planes (or surfaces) of the substrate. Example materials for the S/D features may include, but are not limited to, germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or a combination thereof. The S/D features may be doped with a p-type dopant for forming a p-type FinFET or an n-type dopant for forming an n-type FinFET. The S/D features may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes.

The ILD layer 114 is formed over the substrate 102. In embodiments, the device 100 further includes a contact etch stop layer (not shown) underneath the ILD layer 114. The contact etch stop layer may be made of silicon nitride, silicon oxide, silicon oxynitride, silicon carbide, silicon carbonitride, boron nitride, silicon boron nitride, silicon carbon boron nitride, a combination thereof, and/or other applicable materials. In one embodiment, the contact etch stop layer is silicon nitride. The contact etch stop layer may be formed using any suitable technique, such as chemical vapor deposition (CVD), plasma enhanced chemical vapor deposition (PECVD), high-density plasma CVD (HCP-CVD), or spin-on coating process, etc.

The ILD layer 114 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 114 may be deposited by a PECVD process or other suitable deposition technique. In an embodiment, the ILD layer is formed by a flowable CVD (FCVD) process. The FCVD process includes depositing a flowable material (such as a liquid compound) on the substrate 102 to fill trenches and converting the flowable material to a solid material by a suitable technique, such as annealing in one example. After various deposition processes, a chemical mechanical planarization (CMP) process is performed to planarize a top surface of the ILD layer 114 and to expose a top surface of the dummy gate stacks 110 for subsequent fabrication steps.

Figure 3:
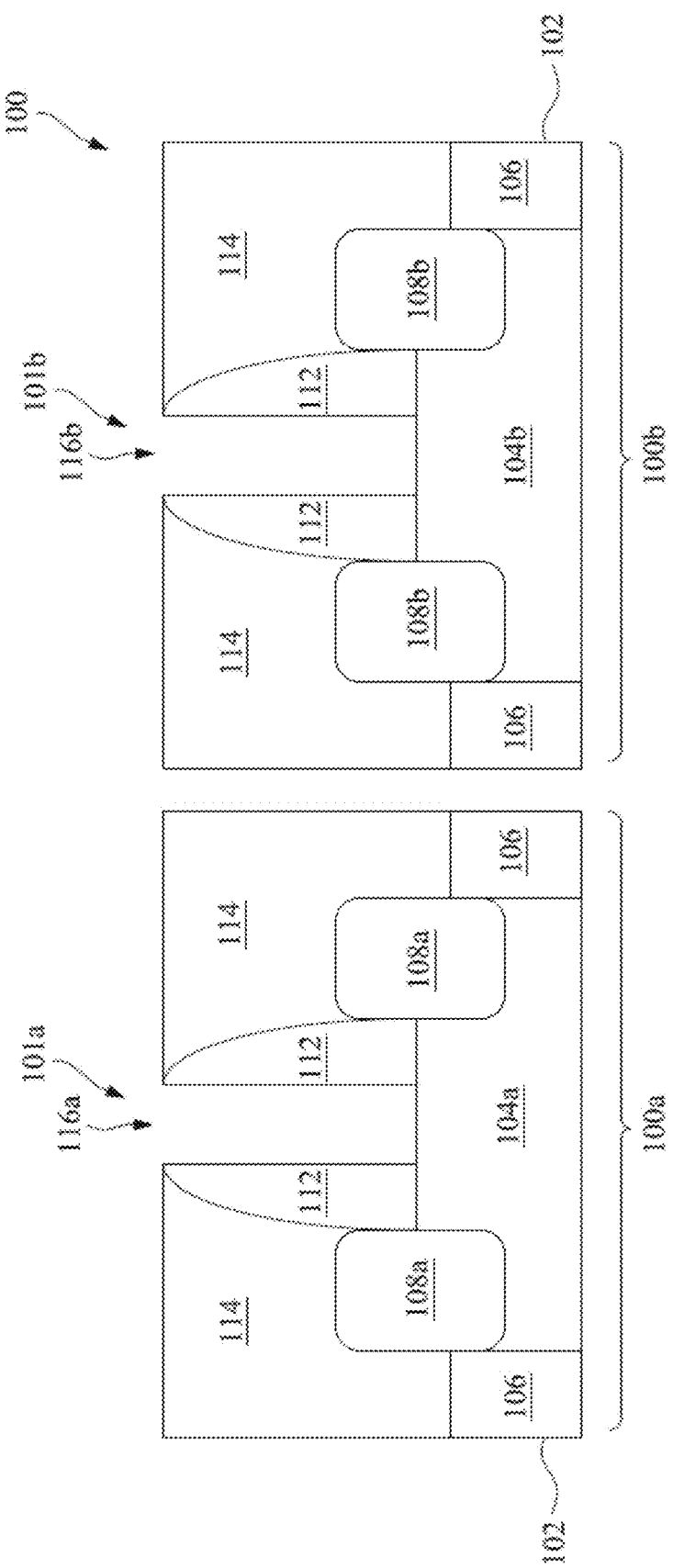

At operation 14, the dummy gate stacks 110 are removed. Referring to FIG. 3, two trenches 116a and 116b are thereby formed in the gate structures 101a and 101b respectively, exposing the fin structures 104a and 104b. The trenches 116a/b are surrounded by structures discussed above, such as the spacer feature 112 and the ILD layer 114. In an embodiment, operation 14 includes one or more etching processes that are selectively tuned to remove the dummy gate stacks 110 (FIG. 2) while the spacer feature 112 and the ILD layer 114 substantially remain. The etching processes may include a suitable wet etch, dry (plasma) etch, and/or other processes. For example, a dry etching process may use chlorine-containing gases, fluorine-containing gases, other etching gases, or a combination thereof. The wet etching solutions may include $NH_4OH$, HF (hydrofluoric acid) or diluted HF, deionized water, TMAH (tetramethylammonium hydroxide), other suitable wet etching solutions, or combinations thereof.

Figure 4:
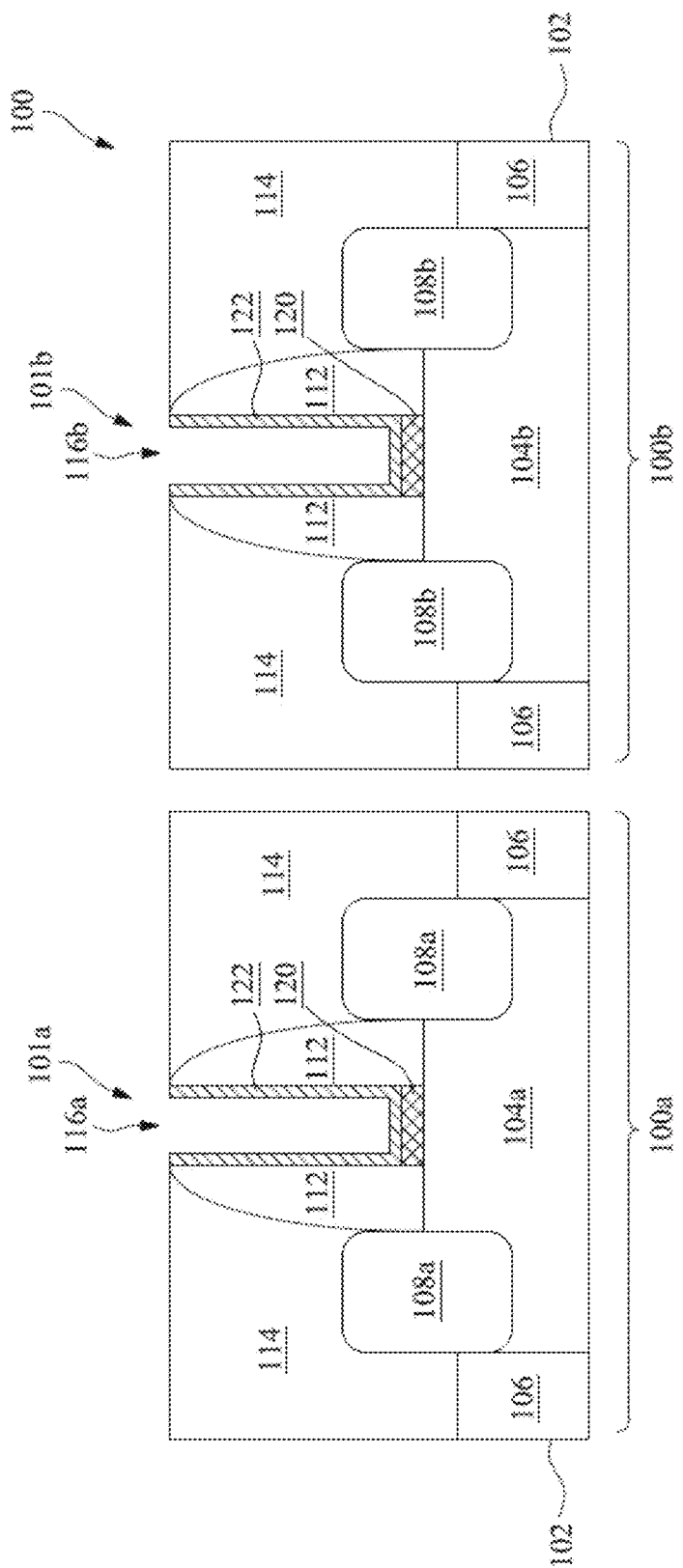

At operation 16, a gate dielectric layer 122 is formed in the trenches 116a/b. The gate dielectric layer 122 is conformally formed on exposed surface of the trenches 116a/b. Referring to FIG. 4, the method 10 may optionally form an interfacial layer 120 at the bottom of the trenches 116a/b underneath the gate dielectric layer 122. For example, the interfacial layer 120 may include a dielectric material such as silicon oxide layer ($SiO_2$) or silicon oxynitride (SiON), and may be formed by chemical oxidation, thermal oxidation, atomic layer deposition (ALD), CVD, and/or other suitable dielectric. In the present embodiment, the gate dielectric layer 122 includes a high-k dielectric material such as hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, hafnium dioxide-alumina ($HfO_2$—$Al_2O_3$) alloy, combinations thereof, or other suitable material. The gate dielectric layer 122 may be formed by ALD and/or other suitable methods such as chemical vapor deposition (CVD), physical vapor deposition (PVD), high density plasma CVD (HDPCVD), metal organic CVD (MOCVD), or plasma enhanced CVD (PECVD). The gate dielectric layer 122 may have a thickness of about 5 to about 20 Å. The interfacial layer 120 may have a thickness of about 5 to about 20 Å. However, other thickness may also be suitable and may be tuned for p-FET devices and for n-FET devices separately.

Figure 5:
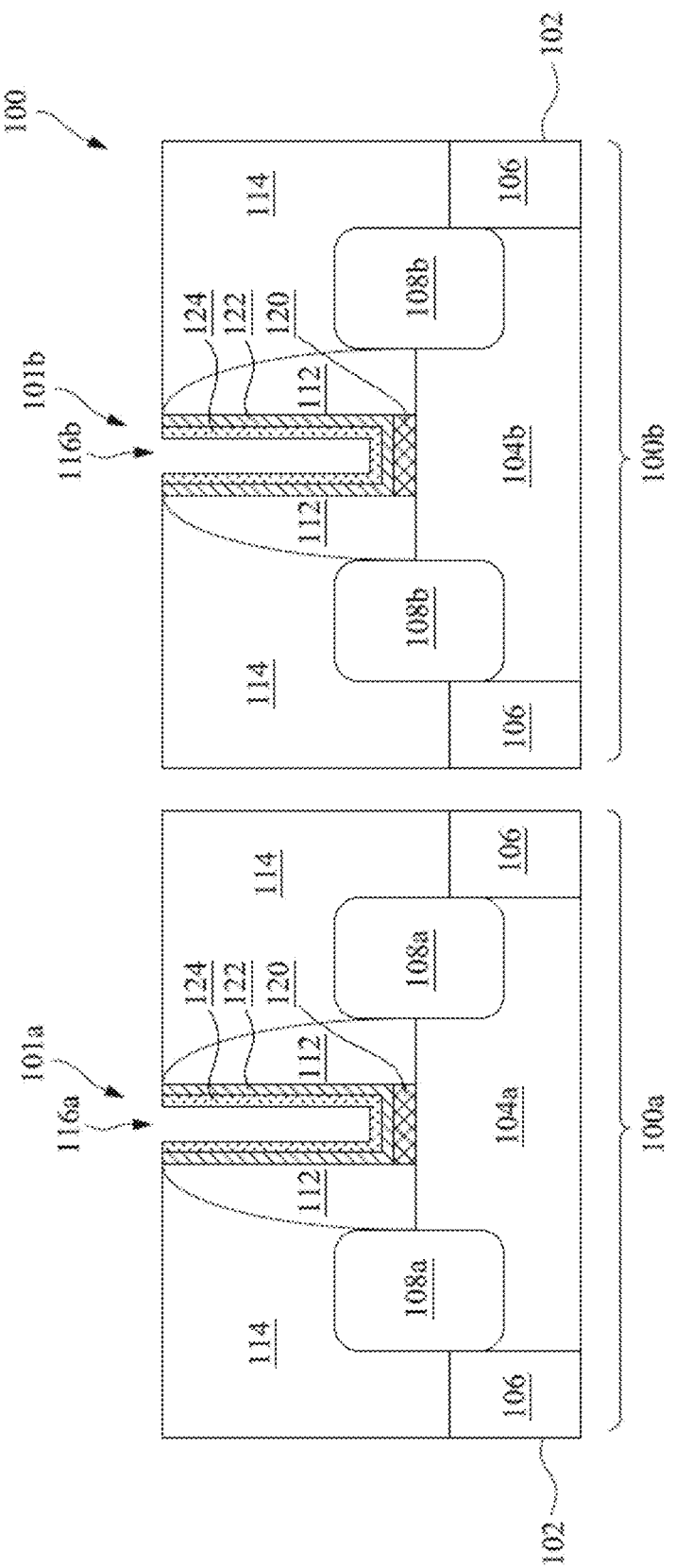

At operation 18, a barrier layer 124 is formed in the trenches 116a/b. Referring to FIG. 5, the barrier layer 124 is also called a metal barrier layer or a metal blocking layer. The barrier layer 124 is formed over the gate dielectric layer 122, and is intended to protect the gate dielectric layer 122 from potential metal impurities introduced in later steps. For example, in the present embodiment, the gate structures 101a/b will be formed to include one or more work function metal layers. Without the barrier layer 124, metal materials from those work function metal layers may diffuse into the gate dielectric layer 122, causing manufacturing defects. In various embodiments, the barrier layer 124 includes a metal element. In the present embodiment, the barrier layer 124 includes tantalum nitride. In another embodiment, the barrier layer 124 includes titanium nitride. In yet another embodiment, the barrier layer 124 includes niobium nitride. Various other materials are suitable. In an embodiment, the barrier layer 124 is formed by ALD, PVD, CVD, or other suitable methods. The barrier layer 124 may have a thickness of about 5 to about 20 Å. However, other thickness may also be suitable and may be tuned for p-FET devices and for n-FET devices separately.

Figure 6:
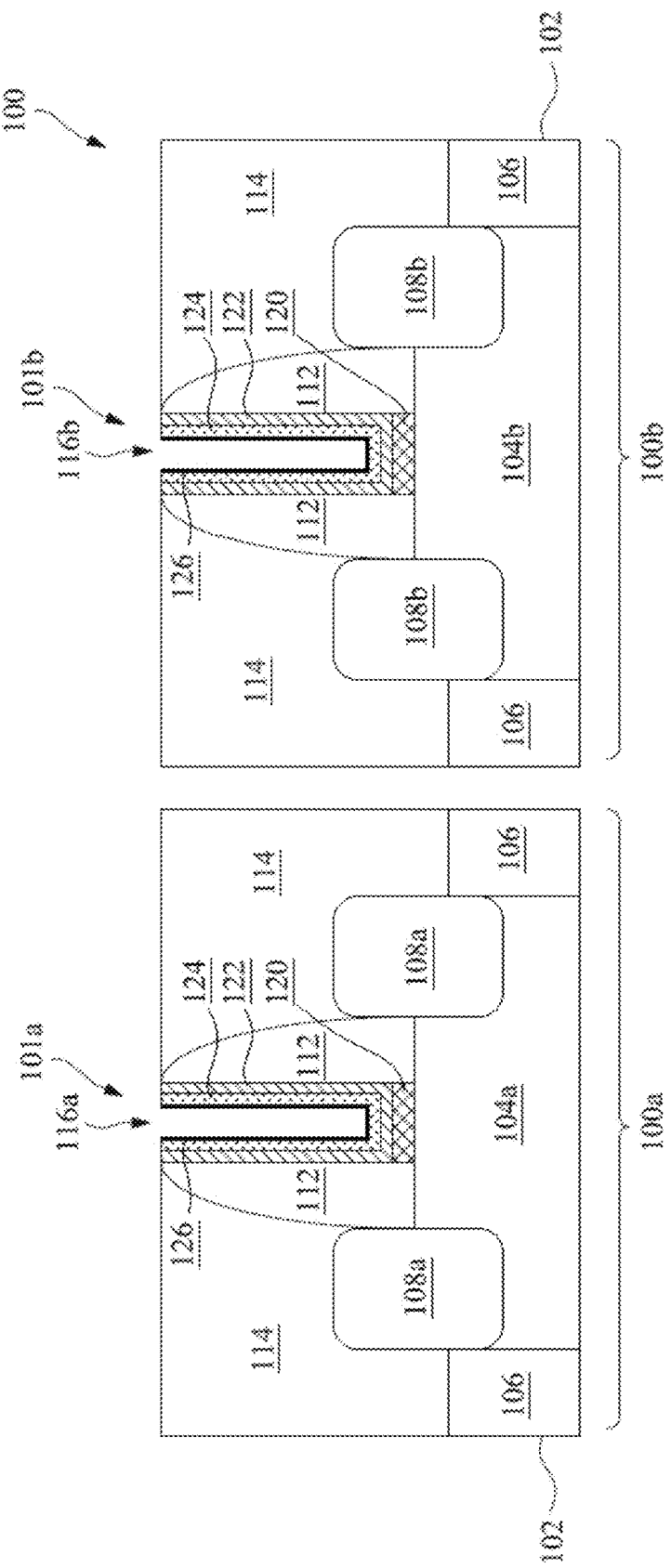

At operation 20, an oxide layer 126 is formed over the barrier layer 124. The oxide layer 126 can provide further protection to the gate dielectric layer 122 as it prevents the etchant used in the later stage from etching through the barrier layer 124. In addition, the oxide layer 126 also serves as a binding layer for a self-assembled monolayer to be formed in the gate structures 101a or 101b for film electric behavior modification, as will be discussed in more detail below. Referring to FIG. 6, the oxide layer 126 is formed in the trenches 116a/b, covering the exposed surface of the barrier layer 124. The oxide layer 126 may be formed by a variety of processes. In one embodiment, the oxide layer 126 is formed by treating the barrier layer 124 with a flow of oxygen. In some embodiments, the barrier layer 124 and the oxide layer 126 contain a common metal element. In one example, the metal element is a transition metal. In an embodiment, the barrier layer 124 includes tantalum nitride and the oxide layer 126 includes tantalum oxide. In another embodiment the barrier layer 124 includes titanium nitride and the oxide layer 126 includes titanium oxide. In yet another embodiment, the barrier layer 124 includes niobium nitride and the oxide layer 126 includes niobium oxide. In an embodiment, oxygen treatment of the barrier layer 124 is performed in a dry etching tool. Alternatively, it may be performed in a dry ashing tool. In an embodiment, the oxygen treatment is performed under a pressure of about 1.5 mTorr, at a temperature of about 30 to about 60° C., with an oxygen flow of about 1 to about 100 mL/min, such as about 30 mL/min, and for about 5 to about 30 seconds. The oxide layer 126 may be formed to about 5 to about 20 Å. However, other thickness may also be suitable and may be tuned for p-FET devices and for n-FET devices separately.

In an alternative embodiment, the oxide layer 126 is formed by one or more deposition processes. In such a case, the barrier layer 124 and the oxide layer 126 may contain the same or different metal elements. In one example, the metal element is a transition metal. For example, a layer of tantalum oxide (e.g., $Ta_2O_5$) may be deposited over the barrier layer 124 under a pressure of about 1 to about 100 Torr, at a temperature of about 250 to about 400° C., and with tantalum tetraethoxy dimethylaminoethoxide as precursor gas and argon as carrier gas. The flow rate of the precursor gas may be set to about 20 standard cubic centimeters per minute (sccm). Deposition of titanium oxide or niobium oxide may be similarly performed if they are used as oxide layer 126. The oxide layer 126 may be formed by chemical oxidation, thermal oxidation, atomic layer deposition (ALD), chemical vapor deposition (CVD), and/or other suitable methods such as low-pressure chemical vapor deposition (LPCVD) and plasma-enhanced CVD (PECVD).

Figure 7:
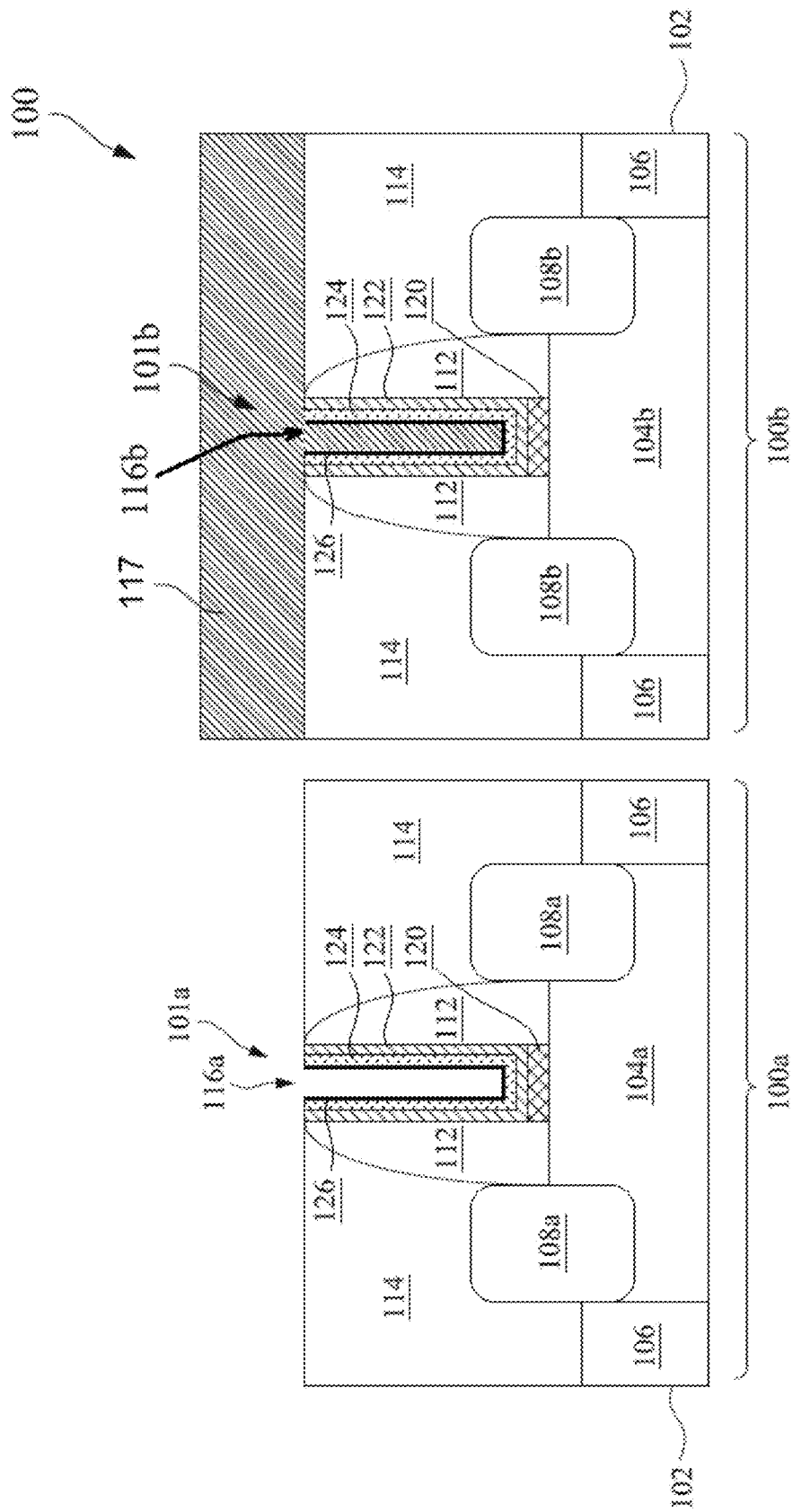

At operation 22, the oxide layer 126 is removed from the trench 116a of the n-FET in the device region 100a. The oxide layer 126 may be removed from the trench 116a by exposing the device region 100a to an etching process while covering the device region 100b with a masking element 117, as shown in FIG. 7. The masking element 117 overfills the trench 116b and fully covers the exposed surface of the device region 100b. In an embodiment, the masking element 117 includes a resist patterned with a photolithography process and may further include a resist under-layer such as a bottom anti-reflective coating (BARC). The photolithography process may include forming a resist layer overlying the substrate 102, exposing the resist to a pattern, performing post-exposure bake processes, and developing the resist to remove its portion over the device region 100b and to form the masking element 117.

The etching process may use an etchant 119 to remove the oxide layer 126 from the trench 116a of the n-FET in the device region 100a. In one embodiment, the etchant 119 includes hydrogen fluoride. The oxide layer 126, for example tantalum oxide ($Ta_2O_5$), is removed by immersing the substrate 102 in a mixture solution of hydrogen fluoride and water. The concentration of hydrogen fluoride may be about 0.2 to about 1 percent by volume, for example about 0.5 percent by volume. In an alternative embodiment, the etchant 119 may include hydrogen fluoride and hydrogen chloride. Hydrogen chloride may be used to adjust the pH value of the solution to a range between 1 and 4, for example 2. In such an example, hydrogen chloride in the aqueous hydrochloric acid solution may be in an amount of about 0.5 to about 10 weight percent (0.5 to 10 wt. %) of the solution. In either case, the etching temperature may be in the range of about room temperature (23° C.) to about 40° C. The mixture solution of the etchant 119 can have any pH value of about 4 or lower, for example a pH of about 1 to about 2.

It is contemplated that operation 22 may be similarly performed to remove the oxide layer 126 from the trench 116b of the p-FET in the device region 100b. In such a case, the oxide layer 126 may be removed from the trench 116b by exposing the device region 100b to an etching process (e.g., etchant 119) while covering the device region 100a with a masking element (e.g., the masking element 117), in a way as discussed above with respect to FIG. 7.

Figure 8:
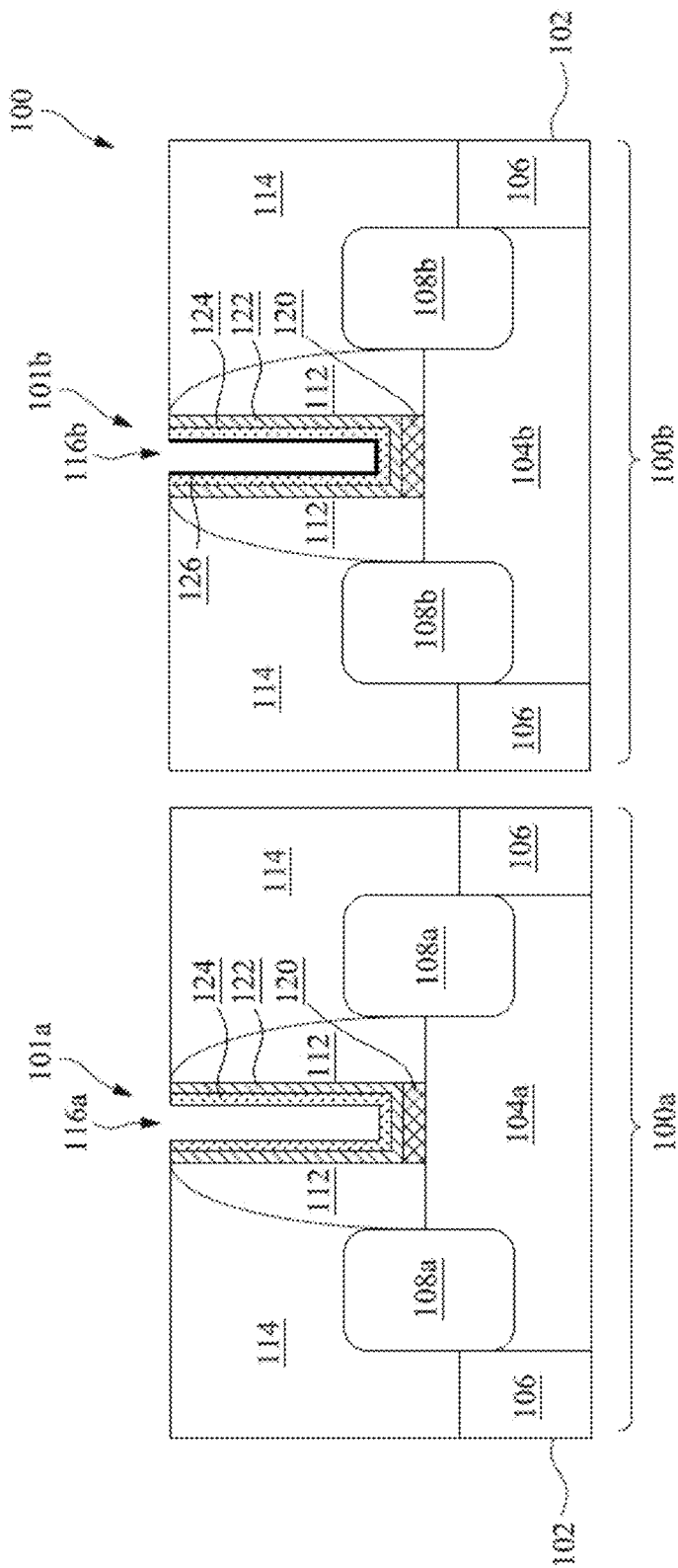

After the oxide layer 126 has been removed from the trench 116a of the n-FET in the device region 100a, the masking element 117 is removed from the device region 100b, as shown in FIG. 8. The masking element 117 may be removed using a suitable process such as resist stripping or ashing.

Figure 9:
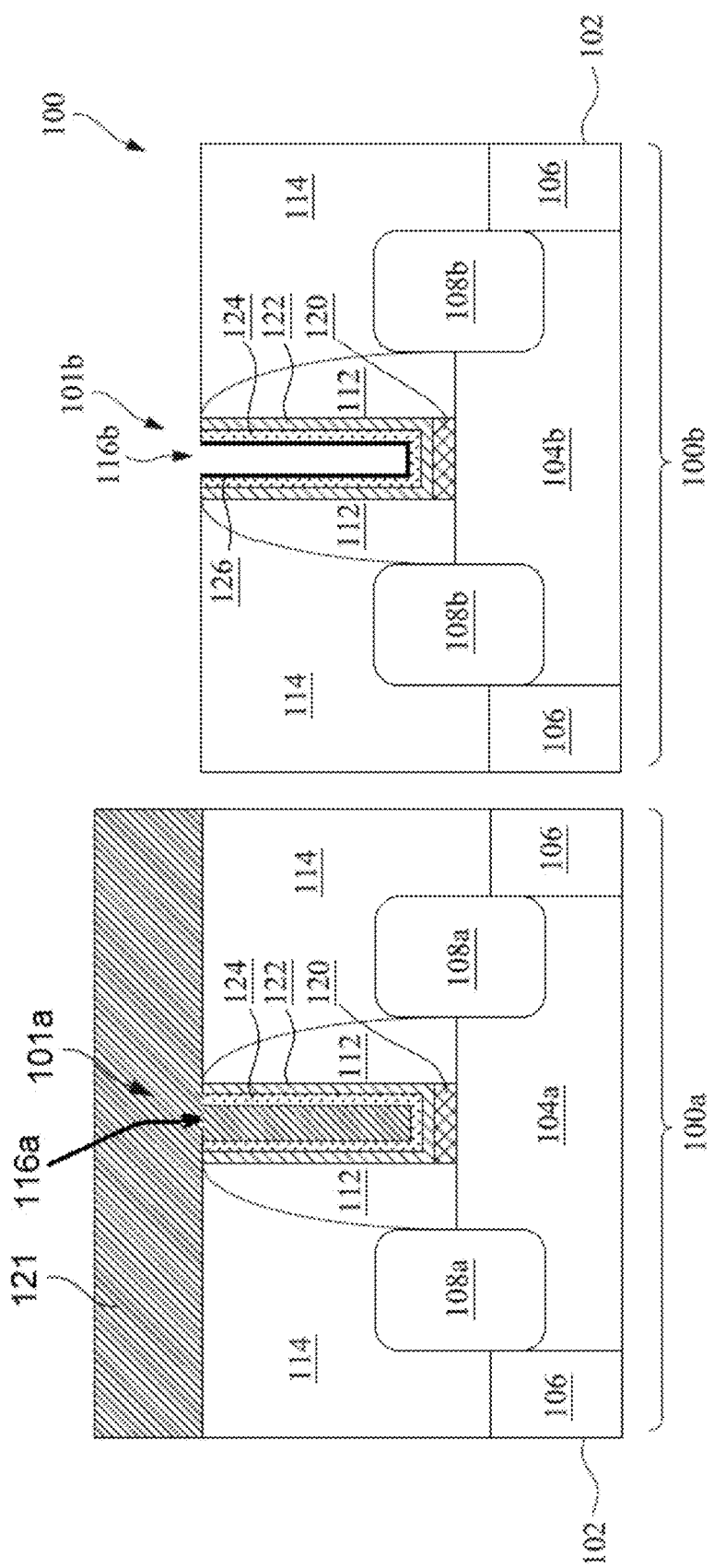

At operation 24, a masking element 121 is formed to cover the device region 100a, as shown in FIG. 9. The masking element 121 overfills the trench 116a and fully covers the exposed surface of the device region 100a. Similar to the masking element 117, the masking element 121 includes a resist patterned with a photolithography process and may further include a resist under-layer such as a bottom anti-reflective coating (BARC). The photolithography process may include forming a resist layer overlying the substrate 102, exposing the resist to a pattern, performing post-exposure bake processes, and developing the resist to remove its portion over the device region 100a and to form the masking element 121.

Figure 10:
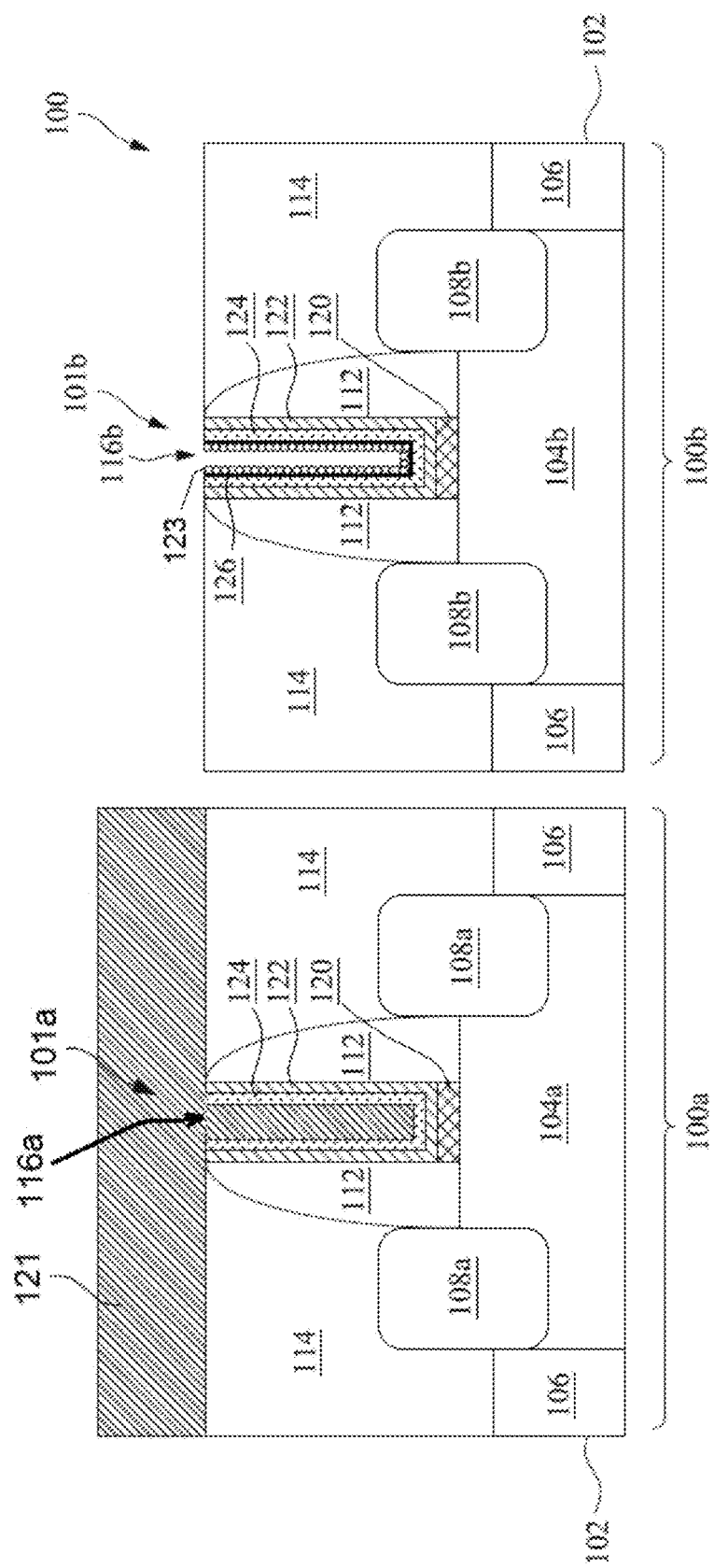

At operation 26, a deposition process is performed for the p-FET in the device region 100b. The deposition process uses a self-assembly deposition process to form one or more self-assembled monolayers (SAM) 123 on the oxide layer 126 in the trench 116b of the p-FET in the device region 100a, as shown in FIG. 10. The SAM 123 can be seen as, or part of, a work function metal layer for the p-FET in the device region 100a as it modifies or tunes electrical behavior such as threshold voltage (Vt) of the metal gates. The term monolayer herein refers to a layer having a thickness approximately equal to a length of a single atom or molecule. In various embodiments, the SAM 123 may have a thickness of about 10 Å or less, for example about 5 Å or less, which may vary depending on the composition of the SAM 123.

The self-assembly deposition process may be performed by spraying, dipping, immersing, soaking, flooding, or rinsing the substrate 102 with a solution based (e.g., liquid based) precursor. In one embodiment, the solution based precursor is sprayed onto the oxide layer 126. The solution based precursor may be prepared by dissolving metal oxides in an aqueous solution of a phosphorous-based acid at a temperature range of about room temperature (23° C.) to about 60° C. for about 10 minutes to 120 minutes, for example about 60 minutes to about 90 minutes. The solution may contain about 10 millimolar/liter to about 1 molar/liter (or about 1-5 wt %) of phosphorous-based acid and about 0.1 to about 10 micrograms/liter of metal oxides. The phosphorous-based acid may be a suitable metal-dissolving acid such as phosphoric acid, organo-phosphoric acid, or the like. In one embodiment, the phosphorous-based acid is phosphoric acid (or orthophosphoric acid). In another embodiment, the phosphorous-based acid is octadecylphosphoric acid. Exemplary metal oxides may include, but are not limited to titanium-containing oxides (e.g., $TiO_2$), niobium-containing oxides (e.g., $Nb_2O_5$), tantalum-containing oxides (e.g., $Ta_2O_5$), aluminum-containing oxides (e.g., $Al_2O_3$), and iron-containing oxides (e.g., $Fe_2O_3$). The SAM 123 may include the same or different metal from the metal of the oxide layer 126. The metal of the SAM 123 is represented as "M" in FIG. 11. Phosphate ions in the aqueous solution of the phosphorous-based acid react chemically with metal ions in the aqueous solution of the phosphorous-based acid, resulting in metal complexes in the aqueous solution.

During the deposition process, the molecules of the self-assembled monolayer (SAM) 123 are spontaneously bonded or adsorbed to the oxide layer 126 in the trench 116b of the p-FET as a result of phosphoric acid chelating. The molecules of the SAM 123 are self-assembled and cross-linked to one another. Without being limited to any particular theory, it is believed a single molecule of SAM 123 will automatically bond to the oxide layer 126 through a network of Phosphorus-Oxygen-Tantalum (PD—O-T) bonds and then subsequently cross-link to two adjacent molecules of SAM 123 that are bonded to the oxide layer 126 (see FIG. 11). The SAM 123 is self-limiting in that the molecules themselves dictate the resulting structure is a single layer. The SAM 123 formed on the oxide layer 126 is beneficial as it can modify the electrical behavior, such as threshold voltage (Vt), of the gate structure 101b and prevent the phosphoric acid from penetrating the oxide layer 126. In cases where the oxide layer 126 is tantalum oxide (e.g., $Ta_2O_5$), the SAM 123 may include closely packed phosphate molecules, such as octadecyl phosphate (ODP) molecules, coordinated onto the tantalum oxide surfaces forming a monolayer. More than one phosphate head group may be coordinated to one tantalum ion and forming mono-dentate and bi-dentate complexes, as the illustrative formula shown in FIG. 11.

In an embodiment where the oxide layer 126 includes titanium oxide (e.g., $TiO_2$) or niobium oxide (e.g., $Nb_2O_5$), the SAM 123 may be similarly formed on the surface of the oxide layer 126 in the trench 116b of the p-FET during the deposition process.

Figure 11:
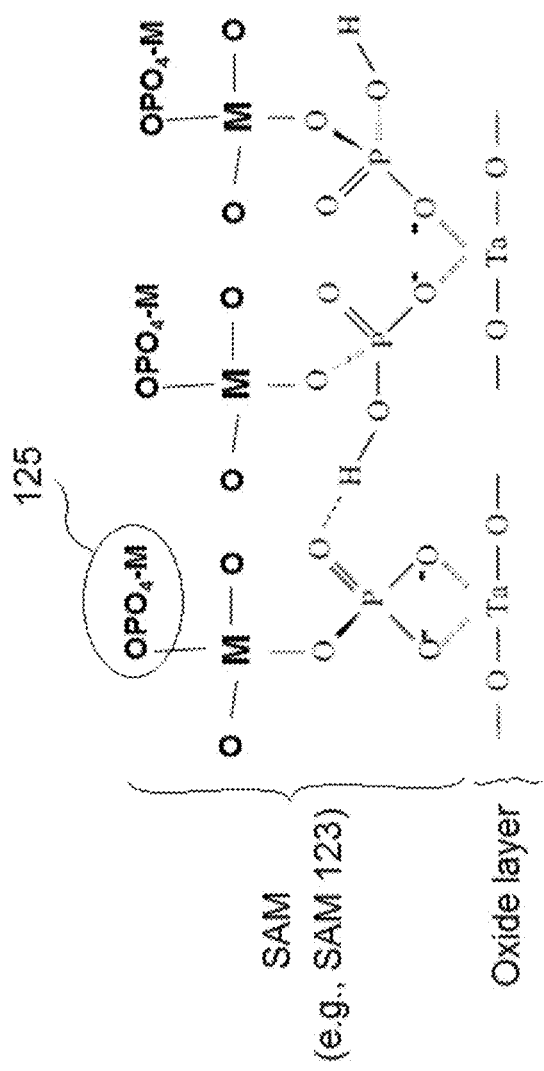

While the deposition process discussed herein is performed on the p-FET in the device region 100b, it is contemplated that the deposition process can be applied to the n-FET in the device region 100a if modification of electrical behavior is desired for the n-FET. In such a case, the operation 22 is performed to remove the oxide layer 126 from the trench 116b of the p-FET in the device region 100b, and then the device region 100b is covered with the masking element. Regardless whether the deposition process is performed on the n-FET or p-FET, in some embodiments after the SAM 123 has been formed on the oxide layer 126, the deposition process discussed above may be similarly performed to form additional self-assembled monolayers 125 (only one layer of SAM 125 is shown in FIG. 11 for illustration purposes) on the previously formed SAM (e.g., SAM 123) to provide multiple work function metal configuration. For example, the deposition process may form a two-layered SAM in which the first SAM includes titanium-containing oxides (e.g., $TiO_2$) and the second SAM includes niobium-containing oxides (e.g., $Nb_2O_5$). In some embodiments, the deposition process may form a three-layered SAM in which the first SAM includes titanium-containing oxides (e.g., $TiO_2$), the second SAM includes niobium-containing oxides (e.g., $Nb_2O_5$), and the third SAM includes tantalum-containing oxides (e.g., $Ta_2O_5$). In some examples, the deposition processes may form a three-layered SAM in which the first SAM includes titanium-containing oxides (e.g., $TiO_2$), the second SAM includes aluminum-containing oxides (e.g., $Al_2O_3$), and the third SAM includes iron-containing oxides (e.g., $Fe_2O_3$). It is understood that these embodiments are merely examples and are not intended to be limiting. The SAM structure may be in any order and can have any number of monolayers to adjust the electrical properties such as threshold voltage (Vt) of the n-FET or p-FET.

Having a self-assembled monolayer (SAM) 123 formed on the oxide layer 126 is beneficial because the SAM 123 and the oxide layer 126 together can provide metal blocking capability to ensure the purity of gate dielectric layer 122. In addition, because the SAM 123 (which functions as work function metal) is made up of closely packed molecules and forms a single layer with a thickness of about 5 Å or less on the oxide layer 126 within the trench 116b, the thickness of the SAM 123 to be deposited is not limited by smaller CD found at advanced process nodes. In contrast, the CVD-formed metal film on opposing sidewalls of the trench is prone to merge. Furthermore, the self-assembly deposition process allows direct metal deposition on dedicated p-type or n-type transistor for threshold voltage ($V_t$) tuning with the presence of photoresist because the SAM 123 can be formed at lower temperatures (e.g., room temperature to 60° C.) by exposing the substrate to a solution based precursor having metal and phosphate complexes. In contrast, conventional CVD process would require multiple metal patterning/removal processes performed at high temperatures (e.g., 300-400° C. or above) to form work function metal for fine tuning threshold voltage of the FinFETs, which is complicated and costly, and may contaminate the work function metal layer during deposition. Metal patterning processes at such high temperatures may also ash the photoresist and/or undesirably etch the barrier layer due to poor etch selectivity of the etchant used during the patterning/removing of the work function metal layers. The conventional metal patterning processes therefore require the NMOS-metal and PMOS-metal to have wet etching selectivity to prevent the NMOS-metal removal from damaging the PMOS-metal. As a result, the choices for the work function metal are limited due to wet etching selectivity. With the inventive wet process based approach, the self-assembled monolayers can be formed without damaging the p-FET or n-FET due to the presence of the photoresist.

After the SAM 123 has been formed, the substrate 102 may be cleaned using a rinse process. The rinse process may use a solution containing DIW, carbonized DIW such as DIW with carbon dioxide, or DIW with diluted $NH_4OH$. The rinse process may be performed at a temperature of about 200° C. to about 80° C. In some embodiments, a drying process may be performed following the rinse process to dry the surface of the SAM 123. For example, the drying process may include a spin drying of the device 100 in the presence of a flow of nitrogen. For example, the drying process may include an isoprophyl alcohol (IPA) drying process.

Figure 12:
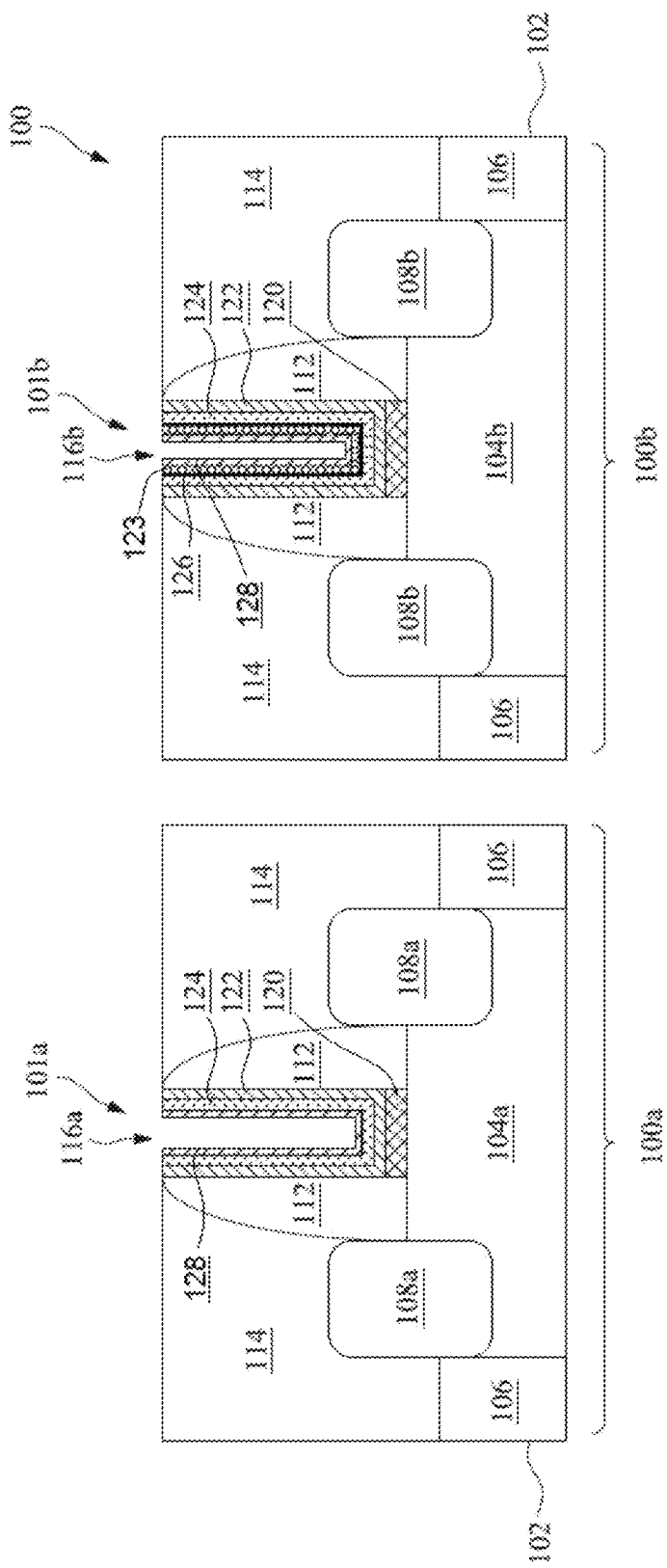

At operation 28, the masking element 121 is removed from the device region 100a and then forming a work function metal layer 128 for the n-FET in the device region 100a and the p-FET in the device region 100b, as shown in FIG. 12. The masking element 121 may be removed using a suitable process such as resist stripping or ashing. The work function metal layer 128 is formed in the trenches 116a and 116b, covering the barrier layer 124 and the SAM 123, respectively. The work function metal layer 128 may include metals or metal compounds such as TiN, TaN, Ru, Mo, Al, WN, $ZrSi_2$, $MoSi_2$, $TaSi_2$, $NiSi_2$, WN, Ti, Ta, Ag, TiAl, TaAl, TaAlC, TiAlN, TaC, TaCN, TaSiN, Mn, Zr, or combinations thereof. The work function metal layer 128 may include a plurality of layers and may be deposited by CVD, PVD, and/or other suitable process.

In one embodiment, the work function metal layer 128 includes a work function material that is suitable for forming an n-FET in the device region 100a. For example, an aluminum-containing material may be used for the work function metal layer 128. The work function metal layer 128 may have a thickness of about 10 to about 50 Å. In the present embodiment, the work function material is deposited into both trenches 116a and 116b even though the work function metal layer 128 is not intended for the p-FETs in the device region 100b. Depositing the work function metal layer 128 simultaneously into the trenches 116a and 116b simplifies process and improves film purity as it does not require part of the device 100 (e.g., device region 100b) to be covered with an organic material, such as a photoresist (or resist). Alternatively, a selective deposition may be performed by covering the device region 100b with a photoresist (or resist) and then depositing the work function material into the trench 116a (or vice versa). It is contemplated that the work function metal layer 128 may include any work function material that is suitable for forming a p-FET in the device region 100b if the SAM were presented in the n-FET in the device region 100a for tuning electrical behavior such as threshold voltage (Vt) of the high-k metal gates.

In the embodiment shown in FIG. 12, the work function material remains in the trench 116b of the p-FET after the work function metal layer 128 has been deposited in the trench 116a. More than one type of material in the metal gate structure can provide wider device tuning window as needed for the p-FET and/or n-FET.

In some embodiments, the work function material may optionally be removed from the trench 116b of the p-FET after the work function metal layer 128 has been deposited in the trench 116a. In such a case, an etching process may use an etchant to remove the work function metal layer 128 from the trench 116b. In one embodiment, the etchant includes phosphoric acid (or orthophosphoric acid), such as 85 weight percent (85 wt. %) of $H_3PO_4$ in an aqueous solution (e.g., $H_2O$). The etching process may be performed at a temperature of about 20 to about 80° C. To further this embodiment, the etchant may be a mixture of phosphoric acid with other components such as hydrogen peroxide ($H_2O_2$), Nitric acid ($HNO_3$), Sulfuric acid ($H_2SO_4$), deionized water (DIW), ammonium hydroxide ($NH_4OH$), ozone ($O_3$), hydrofluoric acid (HF), hydrochloric acid (HCl), other acidic solutions and organic oxidizer, or a combination thereof. In embodiments, the ratio of phosphoric acid in the mixture is about 1:5 to about 1:50.

In some embodiments where an etching process is used to remove the work function material from the trench 116b of the p-FET, a rinse process may be performed after the etching process to remove etching residues from the trench 116b. For example, the rinse process may use a solution containing DIW, carbonized DIW such as DIW with carbon dioxide, or DIW with diluted $NH_4OH$. The rinse process may be performed at a temperature of about 20° C. to about 80° C. Similar to the rinse process discussed previously, the method 10 may further include a drying process to dry the surface of the SAM 123. For example, the drying process may include a spin drying of the device 100 in the presence of a flow of nitrogen. For example, the drying process may include an isoprophyl alcohol (IPA) drying process.

Figure 13:
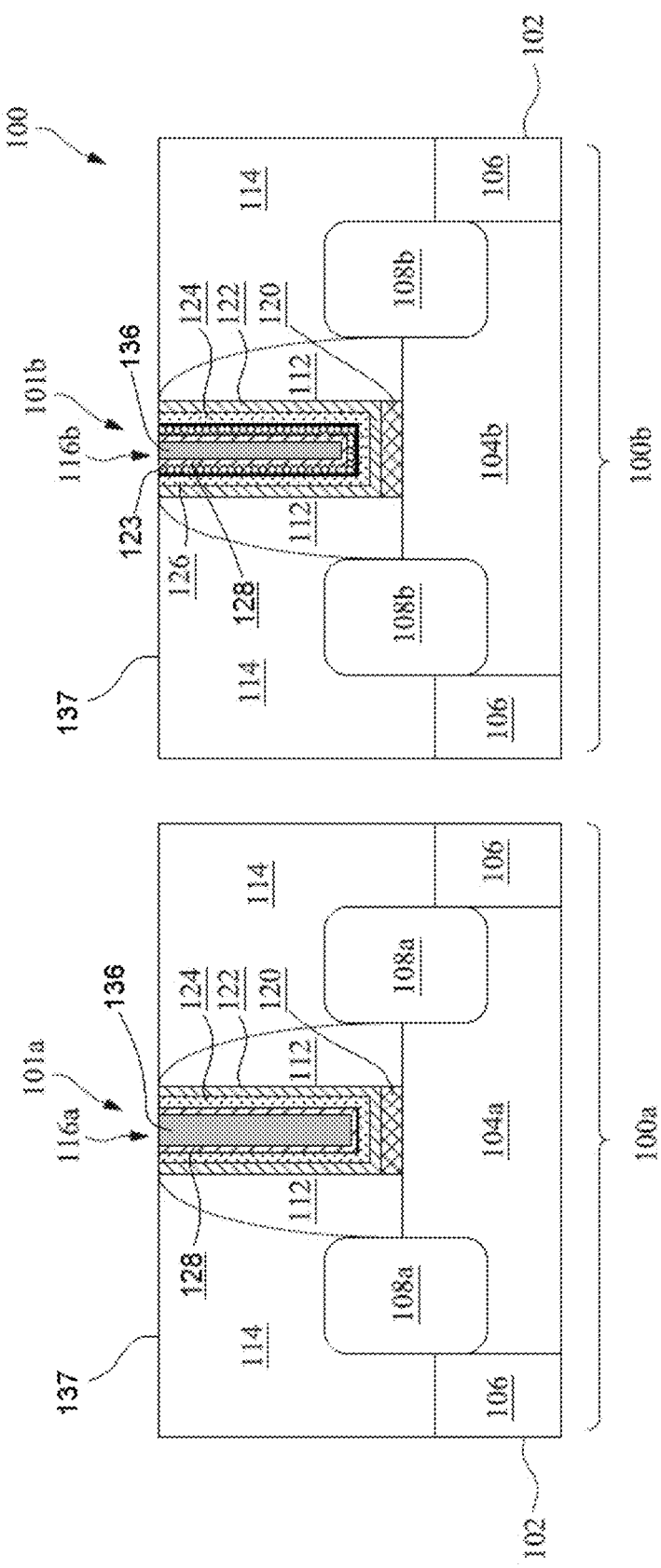

At operation 30, a gate material 136 is formed in the remaining spaces of the trenches 116a and 116b, as shown in FIG. 13. The gate material 136 may include a metal, such as tungsten, aluminum, copper, titanium, tantalum, cobalt, molybdenum, platinum, or combination thereof. The gate material 136 may be formed by CVD, PVD, plating, and/or other suitable processes such as ALD. A planarization process, such as a chemical mechanical polishing (CMP) process, may be performed to remove excess materials from the gate structures 101a and 101b so as to planarize a top surface 137 of the device 100.

Figure 14:
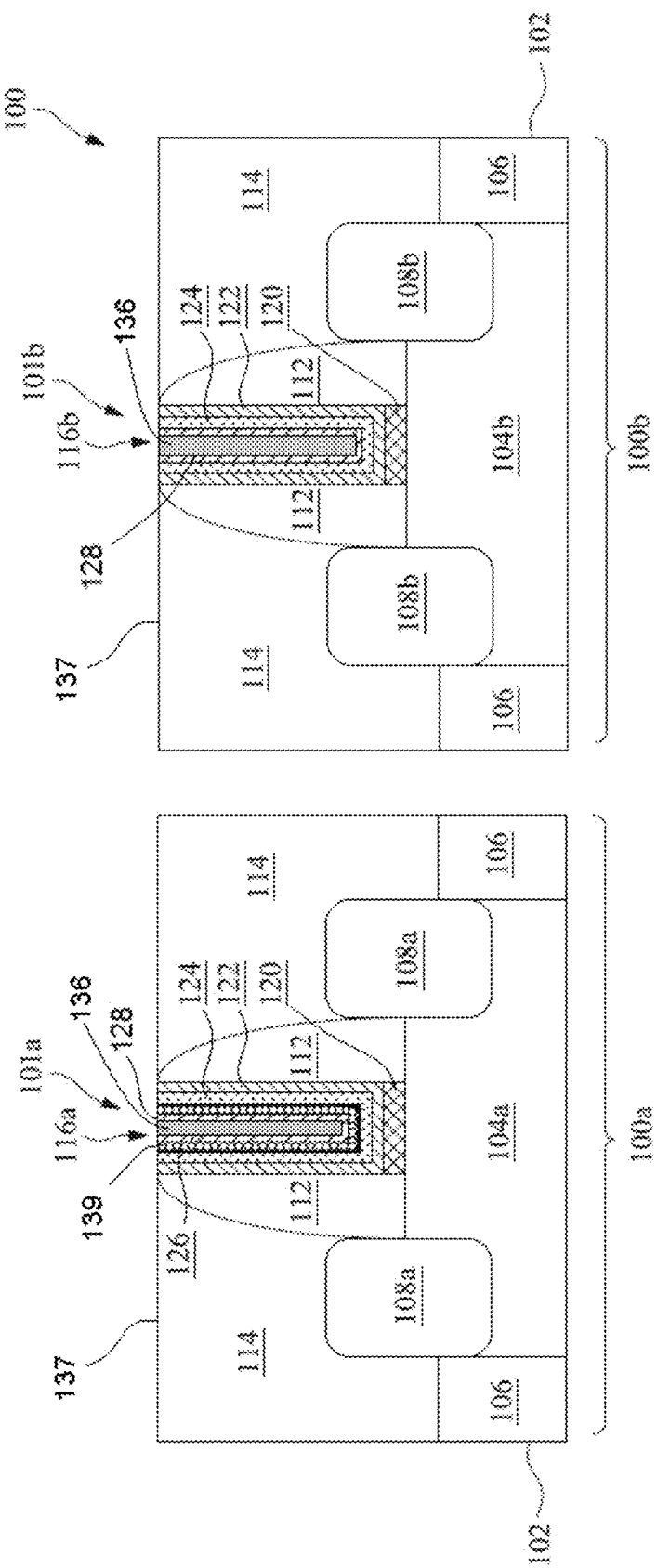

While embodiments discussed above are to show forming a SAM layer on the p-FET in the device region 100b to adjust threshold voltage (Vt) of the p-FET, it is contemplated that various embodiments of the present disclosure can be applied to the n-FET in the device region 100a if modification of electrical behavior is desired for the n-FET. In such a case, the oxide layer 126 can be removed from the trench 116b of the p-FET during the operation 22, and then the device region 100b can be covered with the masking element to form a SAM layer 139 on the oxide layer 126 of the n-FET. FIG. 14 illustrates a schematic cross sectional view of a portion of the device according to such an embodiment. The work function metal layer 128 is then formed in the trench 116a, 116b, respectively, in a way as discussed above. Thereafter, the gate material 136 discussed above is formed in the remaining spaces of the trenches 116a and 116b to complete the metal gate structure. If desired, the SAM layer may be formed on both n-FET and p-FET.

After the top surface 137 of the device 100 has been planarized, the device 100 may be subjected to additional processes, such as forming contacts and vias that electrically connect the source/drain features 108a, 108b and the gate structures 101a, 101b, and forming metal interconnects that connect the FinFETs to other portions of the device 100 to form a complete IC.

Embodiments of the present disclosure provide a wet process based approach of tuning threshold voltage (Vt) for high-k metal gates. In embodiments of the present disclosure, a self-assembled monolayer (SAM) is formed on a protective oxide layer over a gate dielectric layer. The self-assembled monolayer (SAM) may serve as a work function metal to assist threshold voltage ($V_t$) tuning for high-k metal gates. The SAM can be formed at low temperatures (e.g., room temperature to 60° C.) by exposing the substrate to a solution based precursor having metal and phosphate complexes, allowing direct metal deposition on dedicated p-type or n-type transistor in the presence of photoresist that is used to cover the device region not being modified. Therefore, the work function metal is not contaminated during formation. In addition, the SAM is made up of closely packed molecules and forms a single layer with a thickness of about 5 Å or less on the oxide layer within the narrow trench, the thickness of the SAM to be deposited is not limited by smaller CD found at advanced process nodes, as opposed to the CVD-formed metal film having a limitation on thickness because the work function metal layers on opposing sidewalls of the trench are prone to merge and thus fail the device performance.

In one embodiment, a method of forming a semiconductor device is provided. The method includes forming a gate structure over a substrate, the gate structure comprising a gate dielectric layer, a barrier layer formed over the gate dielectric layer, and an oxide layer formed over the barrier layer, and forming a self-assembled monolayer on the oxide layer by exposing the oxide layer to an aqueous solution containing metal oxides in a metal dissolving acid.

In another embodiment, a method of forming a semiconductor device is provided. The method includes providing a substrate comprising a first device region and a second device region, each of the first and second device regions comprising a dielectric layer formed over the substrate, a gate structure formed in the dielectric layer, the gate structure having a trench, a fin structure formed vertically from a surface of the substrate, the fin structure engaging the gate structure, and a source/drain region disposed adjacent to opposing sides of the gate structure, forming a gate dielectric layer in the trench of the gate structure in the first and second device regions, forming a barrier layer over the gate dielectric layer in the trench of the gate structure in the first and second device regions, forming an oxide layer over the barrier layer in the trench of the gate structure in the first and second device regions, removing the oxide layer from the trench of the gate structure in the first device region, and forming a self-assembled monolayer over the oxide layer in the trench of the gate structure in the second device region, the self-assembled monolayer comprising a metal.

In yet another embodiment, a semiconductor device is provided. The semiconductor device includes a substrate, and a first gate structure over the substrate, wherein the first gate structure includes a gate dielectric layer over the substrate, a barrier layer over the gate dielectric layer, an oxide layer over the barrier layer, a self-assembled monolayer on the oxide layer, the self-assembled monolayer comprising a metal, and a metal gate material over the self-assembled monolayer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
   a substrate; and
   a first gate structure over the substrate, wherein the first gate structure comprises:
      a first gate dielectric layer over the substrate;
      a first barrier layer over the first gate dielectric layer;
      an oxide layer over the first barrier layer;
      a self-assembled monolayer on the oxide layer, the self-assembled monolayer comprising a metal; and
      a first metal gate material over the self-assembled monolayer.

2. The semiconductor device of claim 1, wherein the oxide layer comprises a transition metal.

3. The semiconductor device of claim 1 further comprising:
   a second gate structure over the substrate, wherein the second gate structure comprises:
      a second gate dielectric layer over the substrate;
      a second barrier layer over the second gate dielectric layer;
      a second work function metal layer over the second barrier layer; and
      a second metal gate material layer over the second work function metal layer.

4. The semiconductor device of claim 3, further comprising:
   a first work function metal layer between the self-assembled monolayer and the first metal gate material, wherein the first work function metal layer of the first gate structure and the second work function metal layer of the second gate structure are a same material.

5. The semiconductor device of claim 4, further comprising:
   a self-assembled monolayer stack on the self-assembled monolayer, the self-assembled monolayer stack comprising one or more self-assembled monolayers of metal oxide, wherein the metal comprises titanium, niobium, tantalum, aluminum, or iron.

6. The semiconductor device of claim 1, wherein the first barrier layer comprises a nitride.

7. The semiconductor device of claim 1, wherein the first barrier layer comprises a nitride of a first metal and the oxide layer comprises an oxide of the first metal.

8. A semiconductor device, comprising:
   a substrate;
   a first gate structure over the substrate, wherein the first gate structure comprises:
      a first gate dielectric layer over the substrate;
      a first barrier layer over the first gate dielectric layer;
      an oxide layer over the first barrier layer;
      a self-assembled monolayer on the oxide layer, the self-assembled monolayer comprising a metal; and
      a first gate electrode over the self-assembled monolayer; and
   a second gate structure over the substrate, wherein the second gate structure comprises:
      a second gate dielectric layer over the substrate;
      a second barrier layer over the second gate dielectric layer, wherein the first barrier layer and the second barrier layer comprise a same barrier material; and
      a second gate electrode directly on the second barrier layer, wherein the first gate electrode and the second gate electrode comprise a same material structure.

9. The semiconductor device of claim 8, wherein the first gate electrode and the second gate electrode comprises a work function layer and a gate material over the work function layer.

10. The semiconductor device of claim 8, wherein the first barrier layer comprises a nitride of a first metal.

11. The semiconductor device of claim 10, wherein the oxide layer comprises an oxide of the first metal.

12. The semiconductor device of claim 11, wherein the self-assembled monolayer comprises the oxide of the first metal.

13. The semiconductor device of claim 10 further comprising one or more additional self-assembled monolayers over the self-assembled monolayer, wherein the first gate electrode is over the one or more additional self-assembled monolayers.

14. The semiconductor device of claim 8, wherein the first gate structure is a gate structure of an NMOS device, wherein the second gate structure is a gate structure of a PMOS device.

15. The semiconductor device of claim 8, wherein the first gate structure is a gate structure of a PMOS device, wherein the second gate structure is a gate structure of an NMOS device.

16. A semiconductor device, comprising:
   a fin extending from a substrate;
   a dielectric structure over the fin;
   a first gate structure extending through the dielectric structure to the fin, wherein the first gate structure comprises:
      a gate dielectric layer over a surface of the fin and sidewalls of the dielectric structure;
      a barrier layer over the gate dielectric layer, the barrier layer extending over the sidewalls of the dielectric structure;
      an oxide layer over the barrier layer, oxide barrier layer extending over the sidewalls of the dielectric structure;
      one or more self-assembled monolayers on the oxide layer, each of the one or more self-assembled monolayers comprising a metal oxide, the one or more self-assembled monolayers extending over the sidewalls of the dielectric structure; and a metal gate material over the self-assembled monolayer.

17. The semiconductor device of claim 16, wherein the one or more self-assembled monolayers comprise a first self-assembled monolayer and a second self-assembled monolayer, wherein the metal oxide in the first self-assembled monolayer comprises a first metal, wherein the metal oxide in the second self-assembled monolayer comprises a second metal, the first metal being different than the second metal.

18. The semiconductor device of claim 16, wherein the metal oxide comprises a transition metal oxide.

19. The semiconductor device of claim 16, wherein the metal oxide is an oxide of titanium, niobium, tantalum, aluminum, or iron.

20. The semiconductor device of claim 16, wherein the barrier layer and the oxide layer comprises a transition metal.

* * * * *